United States Patent [19]

Deutscher

[11] 4,025,844

[45] May 24, 1977

[54] GRANULAR SUPERCONDUCTING QUANTUM INTERFERENCE DEVICE AND APPARATUS INCLUDING SAME

[75] Inventor: Siegfried Guy Deutscher, Tel Aviv, Israel

[73] Assignee: Ramot University Authority for Applied Research and Industrial Development Ltd., Tel Aviv, Israel

[22] Filed: June 23, 1975

[21] Appl. No.: 589,463

[30] Foreign Application Priority Data

Apr. 24, 1975 Israel .................... 47165

[52] U.S. Cl. ................ 324/43 R; 29/599; 307/306; 357/5
[51] Int. Cl.² ...................... G01R 33/02
[58] Field of Search ........... 324/43 R, 47; 307/306; 29/599; 357/5

[56] References Cited

UNITED STATES PATENTS

| 3,301,643 | 1/1967 | Cannon et al. ............. | 29/599 |
|---|---|---|---|
| 3,504,283 | 3/1970 | Meservey .................. | 307/306 |
| 3,522,492 | 8/1970 | Pierce ..................... | 29/599 |
| 3,824,457 | 7/1974 | Strongin et al. ........... | 324/43 R |

OTHER PUBLICATIONS

Goodkind et al., New Fabrication of Superconducting Flux Detector; Rev. of Sci. Inst., vol. 42, No. 8, (Aug. 1971), pp. 1264–1265.

*Primary Examiner*—Robert J. Corcoran
*Attorney, Agent, or Firm*—Benjamin J. Barish

[57] ABSTRACT

Superconducting quantum interference devices (SQUID's) are described including two superconductor pathways connected together by a narrow bridge of a granular superconductor material having a high normal state electrical resistivity of about $10^{-4}$ to $10^{-2}$ ohm-cm. The latter material is preferably a granular superconductor including superconductor grains having a low normal state electrical resistivity embedded in a matrix of a material having a high normal state electrical resistivity.

Also described is the use of such devices in linear applications, such as in a magnetometers, and digital applications, such as switches, flip-flops, and memory cells.

14 Claims, 6 Drawing Figures

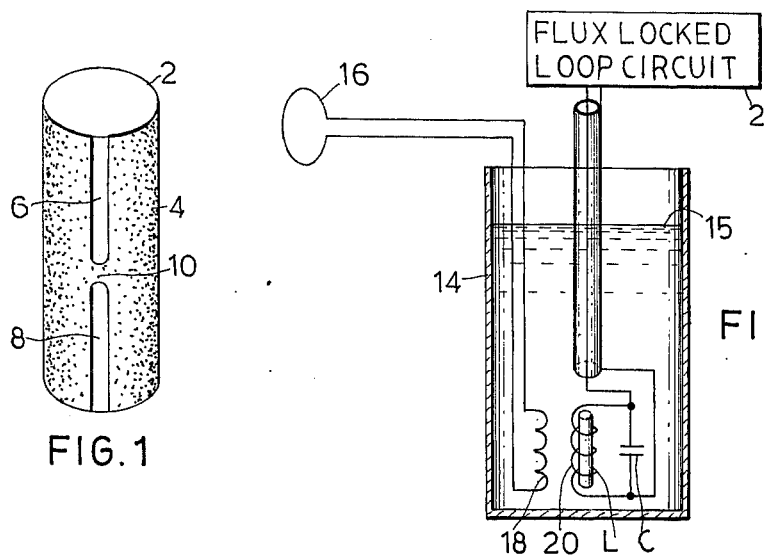
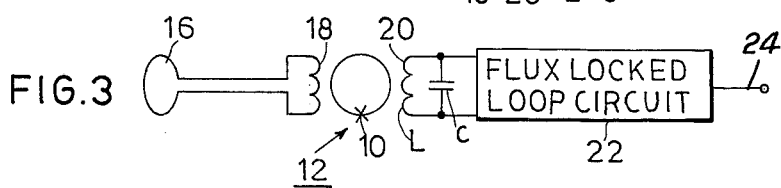
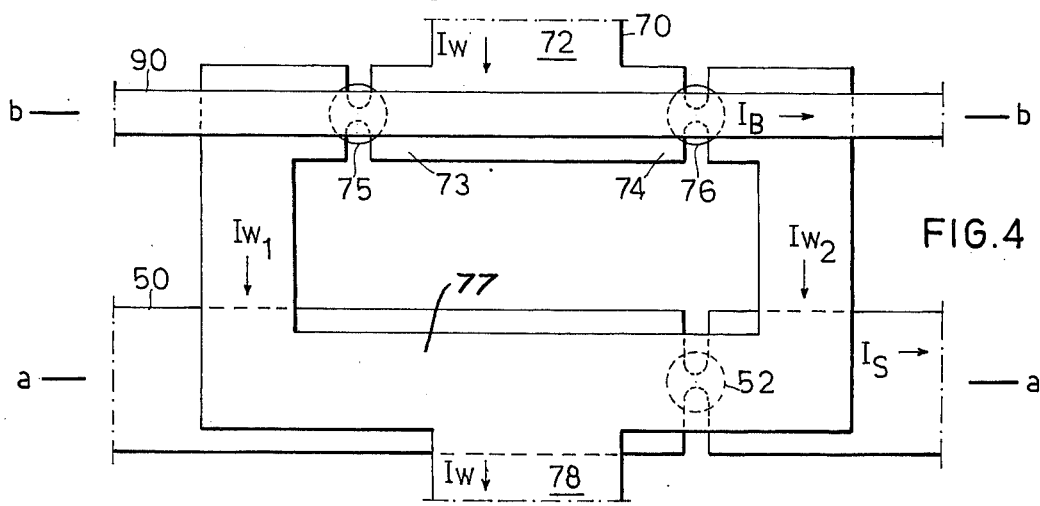
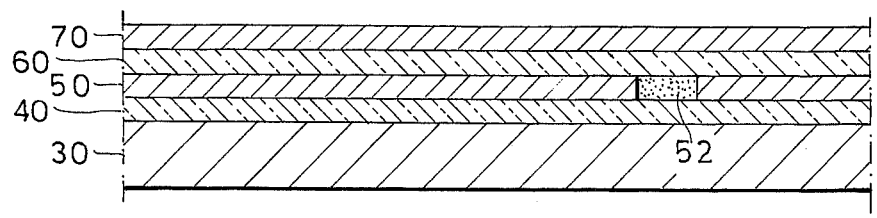
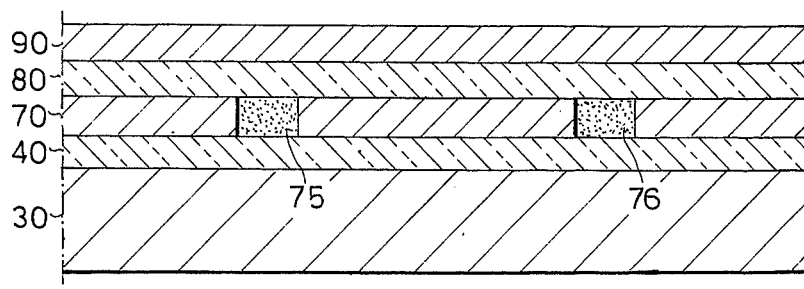

GRANULAR SUPERCONDUCTING QUANTUM INTERFERENCE DEVICE AND APPARATUS INCLUDING SAME

BACKGROUND OF THE INVENTION

The present invention relates to superconductor quantum interference devices, sometimes referred to as SQUID's, and also to systems including such devices.

SQUID's, refrigerated to near absolute zero (about 4° K depending on the material), have been found extremely useful as sensors for measuring various quantities, such as magnetic field, magnetic field gradient, voltage, resistance and mutual inductance. These applications are based on the property of such devices of being "weakly" superconducting, in which both London's concept of fluxoid quantization and the Josephson effect combine to produce a highly sensitive and periodic response to magnetic flux. Such devices are capable of producing magnetometers and other electrical measuring instruments of extremely high sensitivity.

SQUID's have also been proposed for use in digital applications, such as switches, flip-flops, and memory cells. These applications are based on their property of displaying two stable states, namely the normal state, and the superconducting state, the devices being switchable by a small magnetic field from one state to the other. The devices involve very low power dissipation, and therefore they enable dense packing. This produces a very substantial reduction in space requirements as well as in the information transit time, making the device potentially very useful in computer applications.

Both the linear and the digital SQUID's are based on two types of "weak link" coupling junctions, namely:

1. the Josephson junction, consisting of a thin oxide layer (10–20 A) sandwiched between two superconductors and
2. the narrow mechanical constriction or Dayem bridge, having a width and length of the order of a few microns. Both types, in their present state of development, have a number of serious drawbacks:

Among the drawbacks of the Josephson junction type are its fragility, limited lifetime, and poor resistance to thermal cycling.

The mechanical constriction, or bridge device, since it operates only very close to the critical temperature of the superconductor, has a serious dimensional drawback. This is due to the high critical current density in usual superconductors, of the order of $10^6 - 10^7$ A/cm$^2$, somewhat below the critical temperature, which would require an extremely small cross-section of width-times-thickness, in the order of $10^{-11}$ cm$^2$, in order to obtain the small critical current of a few micro-amperes necessary for proper operation of the device. Such small cross-sections are today impractical from an industrial point of view.

The foregoing drawbacks have made SQUID's expensive and relatively unreliable, and therefore such devices have so far found very limited commercial use. This is particularly true with respect to computer applications wherein, notwithstanding a considerable investment of research and development effort, no computer including such devices has yet been commercially released.

SUMMARY OF THE INVENTION

An object of the present invention is to provide a new form of SQUID (Superconducting Quantum Interference Device) having advantages in the above respects. Another object of the invention is to provide measuring apparatus and digital elements, particularly memory cells, including the new SQUID.

According to a broad aspect of the present invention, there is provided a superconducting quantum interference device characterized in that it includes two superconductor pathways connected together by a narrow bridge of a granular superconductor material having a high normal state electrical resistivity of about $10^{-4}$ to $10^{-2}$ ohm-cm.

The invention is particularly useful wherein the granular superconducting material includes superconductor grains of a size in the order of 30A, having a low normal state electrical resistivity, embedded in a matrix of a material having a high normal state electrical resistivity. Examples of granular superconductors are: Al-Al$_2$O$_3$, Al-Ge, Sn-Ge, Pb-PbS, Pb-PbO, Al-Si, Pb-PbTe, and Sn-SnTe.

In the normal state, granular superconductors can have a high normal state electrical resistivity, up to about $10^{-2}$ ohm-cm. The critical current density of such granular superconductors is reduced by two to three orders of magnitude (100 to 1000) compared to that of the pure superconductor. Therefore, the cross-section of the constriction can now be made much larger, about $10^{-8}$cm$^2$. A typical granular SQUID consists of a constriction of up to about $10^{-5}$ cm. in thickness and $5.10^{-3}$ cm in width.

Granular superconducting weak links or SQUIDS in accordance with the present invention are simple to manufacture, have practically an infinite life time, and resist thermal cycling very well. They can replace Josephson junctions and the conventional superconducting weak links, including the proximity effect or Notary's bridge, in their various applications, including linear applications (e.g., magnetometers), and digital applications (e.g., switches, flip-flops, and memory cells).

The new granular superconducting mechanical constriction or bridge devices of the present invention are to be distinguished from the known granular superconducting tunneling devices such as described in Pierce U.S. Pat. No. 3,522,492. The latter devices are essentially many Josephson barriers connected in parallel. They are based on the concept that a small magnetic field produced by a control line is sufficient to switch the gate by penetrating the Josephson barriers which separate the grains forming the gate without having to quench superconductivity in the grains themselves. Their critical characteristic is the thickness of the insulating barrier region between grains, which must be thin enough to permit electron pair tunneling. For this mode of operation to take place, the grain size has to be larger than the coherence length and the penetration depth that characterize the superconducting material that forms the grains. Accordingly, such devices would have a substantially larger grain size, and therefore a substantially larger critical current density and a substantially lower normal state resistivity, than the granular superconducting devices of the present invention, which are based on the mechanical constriction effect rather than on the Josephson junction effect.

Further features and advantages of the invention will be apparent from the description below.

BRIEF DESCRIPTION OF THE DRAWINGS

The invention is herein described, somewhat diagrammatically and by way of example only, with reference to the accompanying drawings, wherein:

FIG. 1 illustrates a SQUID sensor constructed in accordance with the invention and particularly useful in a measuring instrument, such as a magnetometer;

FIG. 2 illustrates a magnetometer including the SQUID sensor of FIG. 1;

FIG. 3 is a schematic circuit diagram of the magnetometer of FIG. 2;

FIG. 4 illustrates a memory cell including SQUID's constructed in accordance with the invention; and FIGS. 4a and 4b are cross-sectional views of the memory cell of FIG. 4 along lines a—a and b—b, respectively.

DESCRIPTION OF THE PREFERRED EMBODIMENTS

With reference to FIG. 1, there is illustrated a SQUID constructed in accordance with the invention, including a rod substrate 2 on which has been coated a film of granular superconductor material having a high normal state electrical resistivity. Film 4 is removed along two spaced lines 6, 8, to form a mechanical constriction or bridge 10 in the gap between the two lines. The film 4 thus defines a ring with the mechanical constriction 10 defining the weak link or bridge therein, this weak link or bridge being of granular superconductor material having a high normal state electrical resistivity.

As one example, the rod substrate 2 may be of sapphire, and the granular superconductor film 4 may be of aluminum grains (30–40%) embedded in an aluminum-oxide matrix (70–60%), with the size of the aluminum grains being about 30 A, the normal state resistivity of the granular film being about $10^{-3}$ ohm cm., the thickness of the film being $0.1\mu$, the bridge 10 being $10\mu$, and the width of lines 6, 8 being $5\mu$. As one mode of preparation, the granular film may be formed by the evaporation of aluminum under a reduced pressure of oxygen onto a rotating sapphire rod; and the mechanical constriction 10 may be formed by mechanical scribing with a diamond.

It will be appreciated that other granular superconductors may be used, examples of a number of others being set forth above. In general the granular superconductor material should have a normal state electrical resistivity of about $10^{-4}$ ohm-cm to about $10^{-2}$ ohm-cm. This would enable the bridge 10 of granular superconductor material to have a thickness of up to $10^{-5}$ cm, and a width of up to $5.10^{-3}$ cm, both of which are easily obtainable in the present state of the art with conventional photo-etching and other known techniques.

FIG. 2 illustrates a known form of magnetometer including the novel SQUID of FIG. 1, and FIG. 3 schematically illustrates the magnetometer circuit of FIG. 2.

The SQUID sensor, generally designated 12, is refrigerated by means of a cryostat 14 containing a liquid helium bath 15. The magnetometer includes an input circuit comprising a pick-up coil 16 external to the cryostat, coupled to a signal coil 18 within the cryostat, the latter coil being magnetically coupled to another coil 20 which is in turn coupled to the SQUID sensor 12 and forms a resonant circuit therewith.

Signal coil 18 thus forms a "flux transformer" with coil 20 and the SQUID sensor 12, which flux transformer is refrigerated and operates under superconducting conditions. This flux transformer employs the property that the total magnetic flux linking a closed superconducting circuit must remain constant, shielding-current flowing in the circuit to ensure that this condition is met. Thus, any change in flux as sensed by the pick-up coil 16 produces a shielding current in the flux transformer, and this current couples flux into the SQUID sensor via the signal coil 18.

The circuit is schematically shown in FIG. 3, wherein the SQUID is drawn as a ring with the granular superconductor bridge 10 indicated by an X. The output of the SQUID is fed to a Flux-Locked-Loop circuit 22 which amplifies and rectifies the output, and generates a feedback current to maintain constant the magnetic field linking the superconducting circuit. This feedback current, the measurement of which is outputted at 24, corresponds to the magnitude of the external magnetic field sensed by pick-up coil 16. Such circuits 22 are known and commercially available for use with conventional SQUID's, and therefore further details are not deemed necessary.

FIGS. 4, 4a and 4b illustrate a known (Anacker) memory cell wherein the various gates are constituted by granular superconductor bridges (weak links) in accordance with the present invention.

Thus, the memory cell of FIGS. 4, 4a and 4b includes a superconducting ground plane 30, a layer of insulation 40 thereover, a conductive pathway 50 constituting the sense element, a layer of insulation 60 thereover, a conductive pathway 70 constituting the memory element, a layer of insulation 80 thereover, and a conductive pathway 90 constituting the control element.

The conductive pathway 70 including the memory element is formed with an input line 72, which is split into two branches 73, 74, each branch including a granular superconductor bridge 75, 76, as described above. The two branches 73, 74 rejoin into branch 77 connected to the output lead 78.

The conductive pathway 50 constituting the sense element includes a granular superconductor bridge 52 in alignment with the common leg 77 of the memory element 70. The conductive pathway 90 constituting the control element is aligned with the two granular superconductor bridges 75, 76 formed in leg 73 of the memory element.

Information is stored in the ring constituted by the two legs 73, 77 of the memory element 70 by clockwise and counterclockwise circulating currents, representing 1 and 0 respectively.

First, assume that a counterclockwise circulating current is stored in the ring (0) state, and it is desired to write in a 1; thus the current $I_{WI}$ in branch $73 = I_M$, and the current $I_{W2}$ in branch $74 = -I_M$. Now a Write pulse ($I_W$) is supplied to input lead 72 coincidentally with a control pulse Ib on pathway 90. The Write current splits into two halves ($I_{W1}, I_{W2}$) because of symmetry, and is superimposed on the circulating current within the cell, so that the current $I_{W1}$ in branch $73 = (I_W/2) + I_M$, and the current $I_{W2}$ in branch $73 = (I_W/2) - I_M$.

$I_{W1}$ critical current $I_{c1}$ of gate 75
$I_{W2}$ critical current $I_{c2}$ of gate 76

The gate defined by the granular superconductor bridge 75 is designed so that it now switches to the normal state. As a result, the current decreases in branch 73 and increases in branch 74. As the current decreases in branch 73, it reaches a value at which gate 75 switches back to the superconducting state, and when the Write current is discontinued, a circulating current is set up but now in the clockwise direction, storing a 1.

The memory cell may be changed back to a 0 in a similar manner, in which case the Write current would have the same direction, but the control current in pathway 90 would be reversed.

Information may be read out non-destructively by applying a Sense current to lead 50. Gate 52, which is constituted of the granular superconductor bridge as described above, is designed to switch only if a 1 is stored in the memory cell. The switching of gate 52 supplies the required information. No current redistribution occurs in branches 73 and 74 this time, so that the circulating current in the cell is undisturbed.

As one example, the granular superconductor material for bridges 75, 76, and 52 may be made of the above-described aluminum grains embedded in an aluminum-oxide matrix, of a width and length of about $5\mu$. The remaining superconductors may be niobium or lead; and the insulation of layers 40, 60 and 80 may be silicon-oxide. The widths of the superconducting elements may be: 40 for pathways 72 and 78; 20 for ring 73, 74, 77; 30 for pathway 50; and 10 for pathway 90.

It will be seen that the novel SQUID's constructed in accordance with the present invention to include the granular superconducting bridges, have substantially the same advantages as the Josephson junction devices, in permitting dense packing and thereby reducing space requirement and transit time. As distinguished from the Josephson junction, however, the granular superconducting bridge devices are simple to manufacture, have practically infinite life time, and have a high degree of resistance to thermal cycling. In addition, they are substantially as fast as the Josephson junctions, but they have the additional advantage that they dissipate even less power because they have a larger normal state resistivity for a similar output voltage, and thus they are capable of even more dense packing than the Josephson junctions, further reducing space requirements and decreasing transit time.

While the invention has been illustrated with respect to magnetometers and memory cells, it will be appreciated that these were chosen merely for purposes of example, and that the invention could be used in other types of measuring apparatus and in other types of digital elements. Many other variations, modifications and applications of the illustrated embodiments will be apparent.

What is claimed is:

1. A superconducting quantum interference device characterized in that it includes two superconductor pathways connected together by a narrow bridge of a granular superconductor material having a high normal state electrical resistivity of about $10^{-4}$ to $10^{-2}$ ohm-cm.

2. The device according to claim 1, wherein said granular superconductor material includes superconductor grains of a size in the order of 30 A having a low normal state electrical resistivity embedded in a matrix of a material having a high normal state electrical resistivity.

3. The device according to claim 1, wherein the bridge of granular superconductor materials has a thickness of up to $10^{-5}$ cm, and a width of up to $5.10^{-3}$ cm.

4. The device according to claim 1, wherein the superconductor pathways and the granular superconductor bridge connecting them are each in the form of a thin film coated on a substrate.

5. The device according to claim 4, wherein the substrate is a rod, the superconductor pathways defining a ring with the granular superconductor bridge forming a weak link therein.

6. The device according to claim 5, wherein the superconductor pathways are also of granular superconductor material having a high normal state electrical resistivity of about $10^{-4}$ to $10^{-2}$ ohm-cm., the weak link being defined by a narrow constriction formed in said ring.

7. The device according to claim 4, wherein the superconductor pathways are of superconductor material having a low normal state electrical resistivity.

8. The device according to claim 1, wherein said granular superconductor material includes grains of aluminum embedded in a matrix of aluminum oxide.

9. The device according to claim 8, wherein said granular superconducting material comprises 30%–40% aluminum grains embedded in a matrix of aluminum oxide, the size of the aluminum grains being about 30 A, the normal state resistivity of the granular film being about $10^{-3}$ ohm-cm.

10. Measuring apparatus characterized in that it includes a sensor device in accordance with claim 1, wherein the superconductor pathways define a ring, and the granular superconductor bridge constitutes a weak link therein.

11. The apparatus according to claim 10, wherein said superconductor pathway ring and the granular superconductor weak link therein are in the form of a coating of a granular superconductor on a rod substrate, portions of the coating being removed to form a constriction defining said weak link bridge.

12. The apparatus according to claim 10, wherein said measuring apparatus is a magnetometer.

13. A digital element characterized in that it includes the device in accordance with claim 1, wherein the superconductor pathways are of a superconductor material having a low normal state of electrical resistivity, and the granular superconductor bridge constitutes a weak link therein, the apparatus further including means for selectively applying a magnetic field to the granular superconductor bridge to switch same to either the superconductor state or to the normal state.

14. The digital element according to claim 13, wherein the digital element is a memory cell including a superconductor ring in which the granular superconductor bridge constitutes a switching gate therein.

* * * * *